(12) United States Patent
Suh et al.

(10) Patent No.: US 9,218,967 B2
(45) Date of Patent: Dec. 22, 2015

(54) METHOD FOR SEPARATING EPITAXIAL LAYER FROM GROWTH SUBSTRATE

(71) Applicant: Seoul Viosys Co., Ltd., Ansan-si (KR)

(72) Inventors: Daewoong Suh, Ansan-si (KR); Kyu Ho Lee, Ansan-si (KR); Jong Min Jang, Ansan-si (KR); Chi Hyun In, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/361,117

(22) PCT Filed: Nov. 27, 2012

(86) PCT No.: PCT/KR2012/010096
§ 371 (c)(1),
(2) Date: May 28, 2014

(87) PCT Pub. No.: WO2013/081348
PCT Pub. Date: Jun. 6, 2013

(65) Prior Publication Data
US 2014/0335677 A1 Nov. 13, 2014

(30) Foreign Application Priority Data
Nov. 28, 2011 (KR) .......... 10-2011-0125105

(51) Int. Cl.
*H01L 21/30* (2006.01)
*H01L 21/46* (2006.01)
(Continued)

(52) U.S. Cl.
CPC ...... *H01L 21/02664* (2013.01); *H01L 21/0254* (2013.01); *H01L 21/02587* (2013.01); *H01L 33/0079* (2013.01)

(58) Field of Classification Search
CPC ........... H01L 2224/81; H01L 2224/97; H01L 21/02664; H01L 21/02587; H01L 21/0254; H01L 33/0079; H01L 21/76254; H01L 21/76259
USPC ......... 438/40, 22, 28, 458; 257/13, 76, 94, 98
See application file for complete search history.

(56) References Cited

U.S. PATENT DOCUMENTS

| | | | |
|---|---|---|---|
| 7,981,713 B2 * | 7/2011 | Shibata | 438/47 |
| 2006/0006554 A1 | 1/2006 | Yoo et al. | |

(Continued)

FOREIGN PATENT DOCUMENTS

| KR | 10-0999695 | 12/2010 |
|---|---|---|
| KR | 10-2011-0103719 | 9/2011 |

OTHER PUBLICATIONS

International Search Report dated Feb. 20, 2013 issued in International Patent Application No. PCT/KR2012/010096.
(Continued)

*Primary Examiner* — Brett Feeney
*Assistant Examiner* — James Chin
(74) *Attorney, Agent, or Firm* — H.C. Park & Associates, PLC

(57) ABSTRACT

The present invention provides a method for separating an epitaxial layer from a growth substrate, comprising growing an epitaxial layer including a plurality of layers on a growth substrate; etching an edge of at least one layer in the epitaxial layer to form a notch; forming a bonding layer on the epitaxial layer, contacting a bonding substrate onto the bonding layer, and then heating the bonding layer to a bonding temperature for joining the epitaxial layer and the bonding substrate; and cooling the bonding layer after the heating of the boding layer, so that the epitaxial layer and the bonding substrate are joined by the bonding layer, and the epitaxial layer is separated from the growth substrate, wherein the separating the epitaxial layer from the growth substrate starts with separation from the at least one layer where the notch is formed.

17 Claims, 3 Drawing Sheets

(51) Int. Cl.
*H01L 21/02* (2006.01)
*H01L 33/00* (2010.01)

(56) References Cited

U.S. PATENT DOCUMENTS

2006/0246687 A1 11/2006 Kaiser et al.
2010/0155740 A1* 6/2010 Chinone et al. ............... 257/76
2010/0207158 A1 8/2010 Jeong
2010/0276726 A1 11/2010 Cho et al.
2012/0119243 A1* 5/2012 Kim et al. ..................... 257/98
2012/0138980 A1* 6/2012 Kuo et al. ..................... 257/94
2013/0087823 A1* 4/2013 Tsai et al. ..................... 257/98
2013/0240831 A1* 9/2013 Lo et al. ........................ 257/13
2014/0023102 A1* 1/2014 Holder et al. ............ 372/44.01

OTHER PUBLICATIONS

Written Opinion dated Feb. 20, 2013 issued in International Patent Application No. PCT/KR2012/010096.

* cited by examiner

METHOD FOR SEPARATING EPITAXIAL LAYER FROM GROWTH SUBSTRATE

CROSS-REFERENCE TO RELATED APPLICATIONS

This application is the National Stage of International Application No. PCT/KR2012/010096, filed on Nov. 27, 2012, and claims priority from and the benefit of Korean Patent Application No. 10-2011-0125105, filed on Nov. 28, 2011, which are hereby incorporated by reference for all purposes as if fully set forth herein.

BACKGROUND

1. Field

The present invention relates to a method for separating an epitaxial layer from a growth substrate.

2. Discussion of the Background

A light emitting diode (LED) is an optical semiconductor device using a principle that when a voltage is applied to a junction of a P-type semiconductor and an N-type semiconductor, energy released upon recombination of electrons in an N-region with holes in a P-region is emitted as light. Such LEDs have characteristics of environmental friendliness, low driving voltages, long lifespan, low costs, etc. Conventionally, the LEDs have been frequently applied to lamps for display or to display of simple information such as numbers. However, with development of industrial technologies, particularly information display and semiconductor technologies, the LEDs have been recently used in various fields such as displays, vehicle headlamps and projectors.

Particularly, an LED using a Group III-V based semiconductor such as gallium nitride (GaN) has a direct transition energy band structure, so that it has an advantage of high internal quantum efficiency. Accordingly, the GaN semiconductor has recently come into the spotlight as a material for LEDs.

In a fabrication of the LED, it is difficult to make a homogeneous substrate on which an epitaxial layer of the LED can be grown. Therefore, the epitaxial layer is grown on a heterogeneous growth substrate having a similar crystal structure by means of a process such as metal organic chemical vapor deposition (MOCVD) or molecular beam epitaxy (MBE). Generally, a sapphire substrate with a hexagonal system is mainly used as a growth substrate. However, since the sapphire substrate is electrically non-conductive, it restricts the structure of an LED formed thereon.

Accordingly, studies have been conducted to develop a technique for fabricating a vertical LED by growing epitaxial layers on a growth substrate such as a sapphire substrate and then separating the growth substrate.

A method for removing a substrate by means of a substrate polishing process may be used as a method for separating the growth substrate. However, the removal of the growth substrate by polishing the growth substrate requires much time and high costs.

Therefore, a laser lift-off (LLO) method, a stress lift-off (SLO) method or a chemical lift-off (CLO) method is mainly used as the method for separating the epitaxial layer from the growth substrate.

Here, the LLO method is a method in which an epitaxial layer is grown on a growth substrate, a support substrate is bonded onto an epitaxial layer, and a laser beam then irradiates through the growth substrate to separate the epitaxial layer from the growth substrate. The SLO method is a method in which a convexo-concave pattern is formed on one surface of a growth substrate, a passivation layer such as an insulation film is formed on some regions of the growth substrate such that an epitaxial layer is grown on only other regions of the growth substrate, and a thick epitaxial layer is grown and then cooled to separate the epitaxial layer from the growth substrate due to surface stress. The CLO method is a method in which a pattern is formed by using a material, which is susceptible to chemical damage, on a surface of a growth substrate, an epitaxial layer is grown, and the material that is susceptible to chemical damage is electrochemically or chemically removed to separate the epitaxial layer from the growth substrate.

However, in the LLO method among the aforementioned methods for separating the growth substrate, heat generated by irradiation of a laser beam has influence on the epitaxial layer, thereby deteriorating characteristics of the epitaxial layer. In the SLO method or CLO method, a separate process of processing the surface of the growth substrate is required before the epitaxial layer is grown, which results in complicated processes as well as problems with mass production due to much time that is taken to separate the epitaxial layer. In the SLO method, the epitaxial layer can be separated without damage thereto only when it is grown to be thick, and thus, it is not easy to apply this method to actual processes.

SUMMARY

An object of the present invention is to provide a method capable of easily separating an epitaxial layer from a growth substrate without having influence on the epitaxial layer.

To achieve the object, a method for separating an epitaxial layer from a growth substrate according to one embodiment of the present invention comprises growing an epitaxial layer comprising a plurality of layers on a growth substrate; etching an edge of at least one layer in the epitaxial layer to form a notch; forming a bonding layer on the epitaxial layer, contacting a bonding substrate onto the bonding layer, and then heating the bonding layer to a bonding temperature for joining the epitaxial layer and the bonding substrate; and cooling the bonding layer after the heating of the bonding layer, so that the epitaxial layer and the bonding substrate are joined by the bonding layer and the epitaxial layer is separated from the growth substrate. The separation of the epitaxial layer from the growth substrate starts with separation from the at least one layer where the notch is formed.

The growth of the epitaxial layer comprising the plurality of layers may comprise growing a heavily doped semiconductor layer on the growth substrate; growing an undoped semiconductor layer on the heavily doped semiconductor layer; and sequentially growing a first semiconductor layer, an active layer and a second semiconductor layer on the undoped semiconductor layer.

Alternatively, the growth of the epitaxial layer comprising the plurality of layers may comprise growing an undoped semiconductor layer on the growth substrate; growing a heavily doped semiconductor layer on the undoped semiconductor layer; and sequentially growing a first semiconductor layer, an active layer and a second semiconductor layer on the heavily doped semiconductor layer.

The notch may be formed in an edge region of the heavily doped semiconductor layer.

Meanwhile, the heavily doped semiconductor layer may comprise n-GaN doped with silicon, and the undoped semiconductor layer may comprise u-GaN.

The notch may be formed by using electro-chemical etching.

According to the present invention, there is an advantage of providing a method capable of easily separating an epitaxial layer from a growth substrate without having a negative influence on the epitaxial layer.

DETAILED DESCRIPTION OF THE ILLUSTRATED EMBODIMENTS

Figure 1:
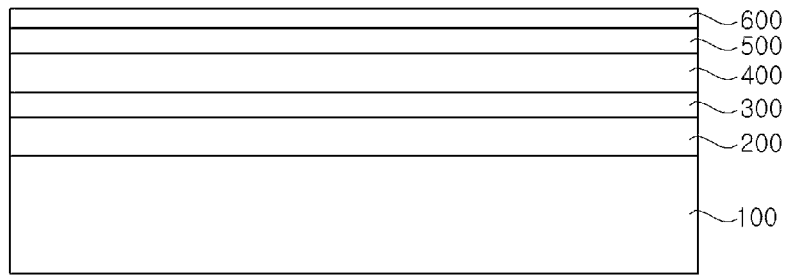
FIGS. 1 to 6 are sectional views illustrating a method for separating an epitaxial layer from a growth substrate according to an embodiment of the present invention.

Hereinafter, exemplary embodiments of the present invention will be described in detail with reference to the accompanying drawings. These embodiments described below are provided by way of example so that the spirit of the present invention can be fully understood by those skilled in the art. Therefore, the present invention is not limited to the embodiments described below but may be implemented into different forms. In the drawings, the widths, lengths, thicknesses and the like of elements may be exaggerated for convenience. Further, an expression that an element is placed "on" or "above" another element indicates not only a case where the element is placed "directly on" or "directly above" the other element but also a case where a further element is interposed between the element and the other element. Like reference numerals are used to designate like elements throughout the specification and drawings.

FIGS. 1 to 6 are sectional views illustrating a method for separating an epitaxial layer from a growth substrate according to an embodiment of the present invention.

Referring to FIG. 1, a growth substrate 100 is first prepared.

The growth substrate 100 may be any substrate, e.g., a sapphire substrate, a silicon carbide substrate, a silicon substrate or the like, on which a semiconductor layer described later, particularly a layer of a Group III nitride can be epitaxially grown. Preferably, the growth substrate 100 may be a sapphire substrate.

Subsequently, an epitaxial layer including a plurality of layers is grown on one surface of the growth substrate 100.

A heavily doped semiconductor layer 200 is grown on the one surface of the growth substrate 100. Subsequently, an undoped semiconductor layer 300 is grown on the heavily doped semiconductor layer 200. A first semiconductor layer 400, an active layer 500 and a second semiconductor layer 600 may be sequentially grown on the undoped semiconductor layer 300.

Although not shown in this figure, a superlattice layer (not shown) may be further grown between the first semiconductor layer 400 and the active layer 500, and an electron blocking layer (not shown) may be further grown between the active layer 500 and the second semiconductor layer 600.

The heavily doped semiconductor layer 200 may include n-GaN doped with silicon (Si) at a high concentration. The heavily doped semiconductor layer 200 may be formed to have a thickness of 0.1 to 20 μm, and preferably a thickness of 3 μm.

The undoped semiconductor layer 300 may include u-GaN undoped with impurities.

The first semiconductor layer 400 may include a semiconductor layer of a Group III nitride such as (Al, Ga, In)N. The first semiconductor layer 400 may be a GaN layer doped with N-type impurities such as Si, i.e., an N—GaN layer. The first semiconductor layer 400 may be formed as a single layer or multilayer. In a case where the first semiconductor layer 400 is formed as a multilayer, the first semiconductor layer 400 may include a superlattice layer.

The active layer 500 may include a semiconductor layer of a Group III nitride such as (Al, Ga, In)N. The active layer may include a single layer or a plurality of layers. The active layer 500 may be a layer that at least emits light of a wavelength, e.g., ultraviolet light. The active layer 500 may have a single quantum well structure including one well layer (not shown), or may have a multiple quantum well structure in which well layers (not shown) and barrier layers (not shown) are alternately laminated. In this case, one or both of the well layers and the barrier layers may be formed to have a superlattice structure.

The second semiconductor layer 600 may include a semiconductor layer of a Group III nitride such as (Al, Ga, In)N. The second semiconductor layer 600 may be a GaN layer doped with P-type impurities such as Mg, i.e., a P-GaN layer. The second semiconductor layer 600 may be formed as a single layer or multilayer. For example, the second semiconductor layer 600 may include a superlattice layer.

The superlattice layer (not shown) may be positioned between the first semiconductor layer 400 and the active layer 500, and may have a structure in which a plurality of Group III-N based compound semiconductor layers are laminated, e.g., InN layers and InGaN layers are repetitively laminated. The superlattice layer (not shown) can be grown earlier than the active layer 500 so as to prevent a dislocation, defect or the like from diffusing or propagating to the active layer 500. Thus, the superlattice layer (not shown) can serve to reduce formation of a defect such as a dislocation in the active layer 500 and also to improve crystallinity of the active layer 500.

The electron blocking layer (not shown) may be positioned between the active layer 500 and the second semiconductor layer 600 so as to improve the efficiency of recombination of electrons and holes, and may include a semiconductor layer formed of a material having a relatively wide bandgap. The electron blocking layer (not shown) may include an (Al, In, Ga)N-based Group III nitride semiconductor layer. For example, the electron blocking layer may include a P-AlGaN layer doped with Mg.

Figure 2:
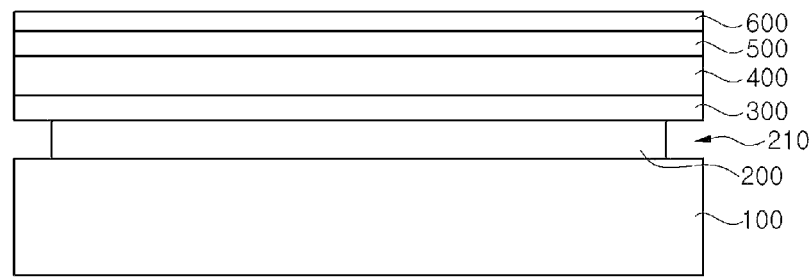

Referring to FIG. 2, after the epitaxial layer including the plurality of layers including the high-concentration semiconductor layer 200, the undoped semiconductor layer 300, the first semiconductor layer 400, the active layer 500 and the second semiconductor layer 600 is grown on the growth substrate 100, a notch 210 is formed by etching an edge region of any one of the plurality of layers in the epitaxial layer.

In this case, at least one layer of the plurality of layers in the epitaxial layer may be the heavily doped semiconductor layer 200.

The notch 210 may be formed by etching the heavily doped semiconductor layer 200, and the etching may be, for example, an electro-chemical etching (ECE). The electro-chemical etching of the heavily doped semiconductor layer 200 includes immersing the growth substrate 100 on which the epitaxial layer including the plurality of layers has been grown into an electrolyte solution and then applying a voltage to the heavily doped semiconductor layer 200. Accordingly, the edge region of the heavily doped semiconductor layer 200 exposed to a side surface of the growth substrate 100 is electro-chemically etched inwardly, so that the notch 210 can be formed.

Figure 3:
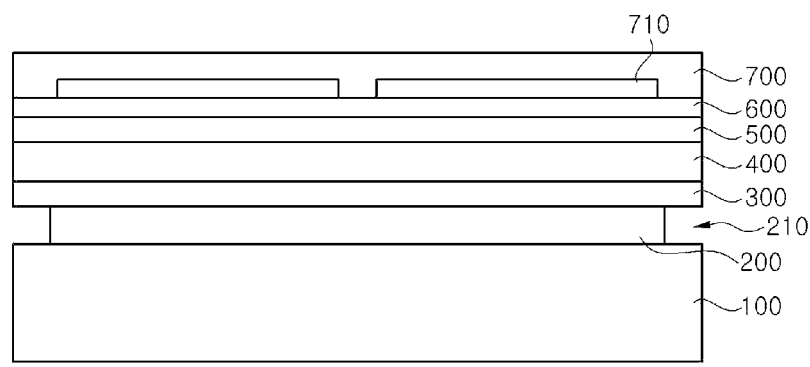

Referring to FIG. 3, a bonding layer 700 is formed on the epitaxial layer including the plurality of layers.

In this case, before the bonding layer 700 is formed, a metallic reflective pattern layer 710 may be further formed on the epitaxial layer including the plurality of layers. The metallic reflective pattern layer 710 may reflect light, and/or may serve to electrically connect the epitaxial layer including the plurality of layers, particularly the second semiconductor layer 600, to the bonding layer 700 and/or a bonding substrate 800 described later.

The bonding layer 700 joins the bonding substrate 800 described later and the second semiconductor layer 600 or the metallic reflective pattern layer 710. The bonding layer 700 may be formed of a conductive material that performs bonding by being heated to a bonding temperature, e.g., a temperature of 100 to 500° C. and then cooled. Preferably, the bonding layer 700 may be formed of an alloy containing zinc (Sn) or an alloy containing copper, gold, silver or the like. However, the present invention is not limited thereto.

Although not shown in this figure, when all or some of the plurality of layers in the epitaxial layer, e.g., the first semiconductor layer 400, the active layer 500 and the second semiconductor layer 600, are patterned by etching, an etching stop pattern (not shown) used as an etching stop layer may be further formed between segments of the metallic reflective pattern layer 710.

The metallic reflective pattern layer 710 may be formed of a material including a metal capable of reflecting light. Preferably, the metallic reflective pattern layer 710 may be formed of a reflective and conductive metallic material, e.g., a material including nickel (Ni), platinum (Pt), palladium (Pd), rhodium (Rh), tungsten (W), titanium (Ti), silver (Ag) or gold (Au).

The etching stop pattern (not shown) may be formed of an insulating material including a silicon oxide film, a silicon nitride film or the like.

Figure 4:
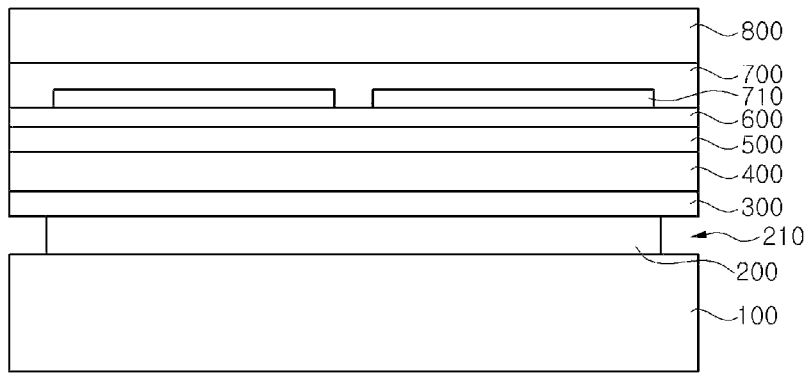

Referring to FIG. 4, the bonding substrate 800 is prepared separately from the process of preparing the growth substrate 100 and growing the epitaxial layer including the plurality of layers on the growth substrate 100.

The bonding substrate 800 may include a conductive material, e.g., copper, having a thermal expansion coefficient considerably different from that of the epitaxial layer including the plurality of layers.

The bonding substrate 800 is brought into contact with the bonding layer 700.

Subsequently, the bonding layer 700 and the bonding substrate 800 are heated while they are in contact with each other. At this time, they are heated to a bonding temperature at which the bonding layer 700 joins the epitaxial layer including the plurality of layers and the bonding substrate 800, and are then cooled so that the bonding layer 700 can join the epitaxial layer including the plurality of layers and the bonding substrate 800.

That is, in a case where the bonding layer 700 is made of an alloy including Zn, e.g., a solder, the bonding layer 700 is heated to a temperature of about 450° C. such that the bonding layer 700 is reflowed, and then cooled so that the epitaxial layer including the plurality of layers and the bonding substrate 800 are joined.

Figure 5:
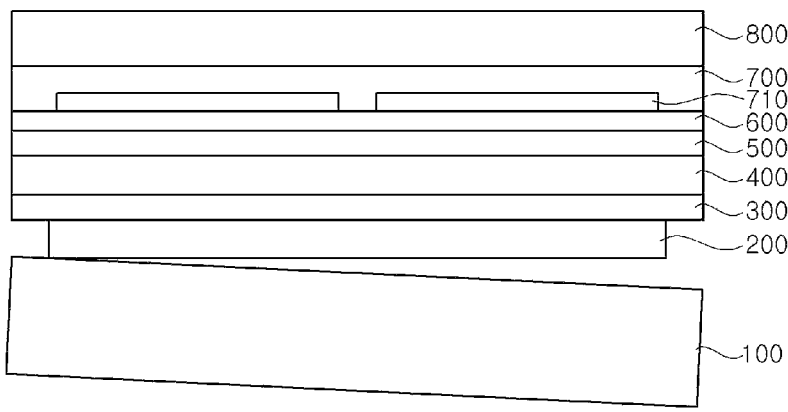

Referring to FIG. 5, the epitaxial layer including the plurality of layers and the bonding substrate 800 are separated from the growth substrate 100 by heating the bonding layer 700 to the bonding temperature and then cooling the bonding layer 700.

At this time, for the separation of the epitaxial layer including the plurality of layers from the growth substrate 100, upon performing the heating to the bonding temperature and the subsequent cooling, the epitaxial layer including the plurality of layers and the bonding substrate 800 are also heated to the same temperature and then cooled. Since the epitaxial layer including the plurality of layers and the bonding substrate 800 have a large difference in thermal expansion coefficient therebetween, thermal stress is generated so that the epitaxial layer including the plurality of layers is separated from the growth substrate 100.

This separation may start with separation from the heavily doped semiconductor layer 200 where the notch 210 is formed. Particularly, the separation may start from the notch 210 formed in an edge region of the heavily doped semiconductor layer 200. That is, the thermal stress generated by the difference in thermal expansion coefficient between the epitaxial layer including the plurality of layers and the bonding substrate 800 is concentrated on the notch 210, and a crack is created from the notch 210 on which the thermal stress is concentrated. Thus, the epitaxial layer including the plurality of layers can be separated from the growth substrate 100.

In this case, the separation can be further facilitated by applying an impact to the notch 210 using a sharp tool.

Figure 6:
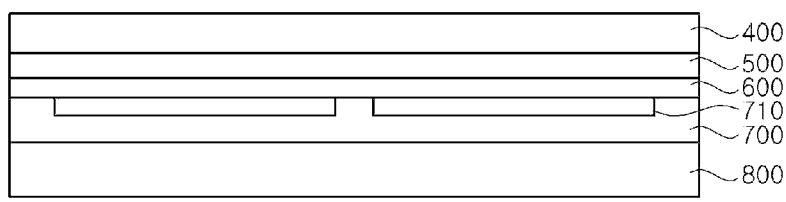

Referring to FIG. 6, after the growth substrate 100 is separated, the exposed heavily doped semiconductor layer 200 and the undoped semiconductor layer 300 positioned beneath the heavily doped semiconductor layer 200 can be removed, thereby completing the process of separating the epitaxial layer including the plurality of layers from the growth substrate 100.

The removal of the exposed heavily doped semiconductor layer 200 and the undoped semiconductor layer 300 may be made by a planarization process or an etching process.

When the growth substrate 100 is separated, the exposed heavily doped semiconductor layer 200 might have been damaged due to concentration of the thermal stress. The damaged heavily doped semiconductor layer 200 may be a cause that lowers light emitting efficiency when an LED device is fabricated using the epitaxial layer including the plurality of layers and the bonding substrate 800. Therefore, the heavily doped semiconductor layer 200 may be removed after the separation process is finished.

In a case where an LED device is fabricated using the epitaxial layer including the plurality of layers and the bonding substrate 800, the undoped semiconductor layer 300 may be removed to expose a surface of the first semiconductor layer 400 in the epitaxial layer including the plurality of layers after the separating process is finished.

At this time, although it is illustrated in this figure that the exposed heavily doped semiconductor layer 200 and the undoped semiconductor layer 300 have been removed, they may be left without being removed.

Figure 7:
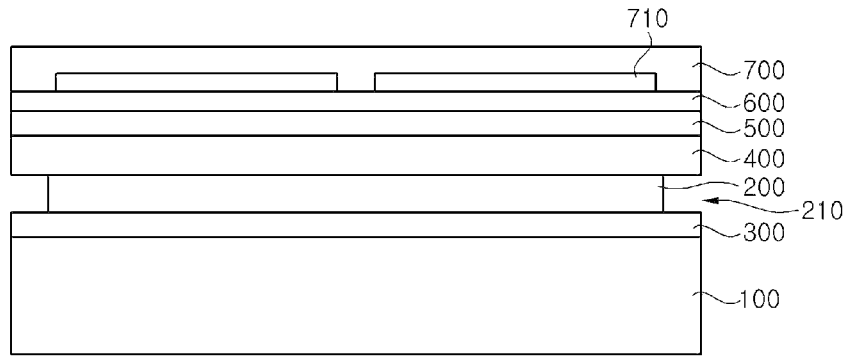
FIGS. 7 to 9 are sectional views illustrating a method for separating an epitaxial layer from a growth substrate according to another embodiment of the present invention.
Figure 8:
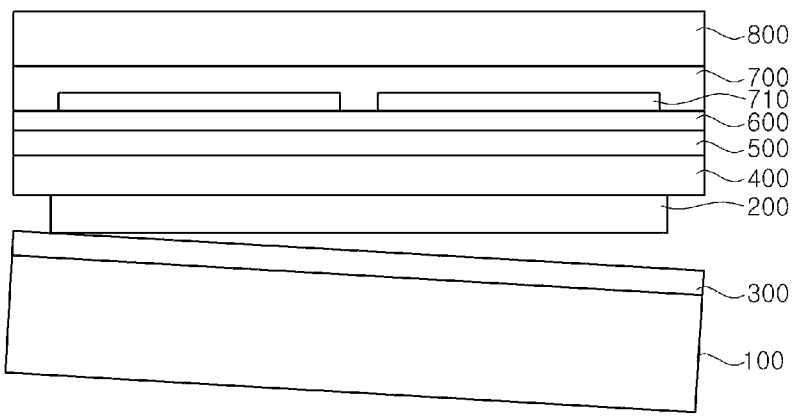
Figure 9:
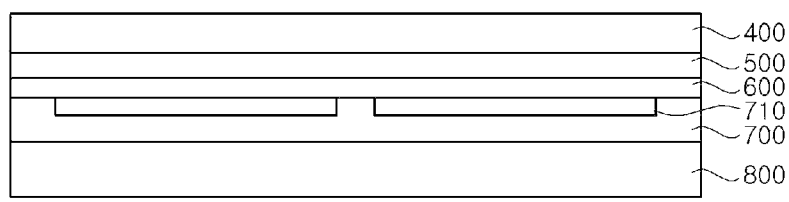

FIGS. 7 to 9 are sectional views illustrating a method for separating an epitaxial layer from a growth substrate according to another embodiment of the present invention.

The method according to this embodiment will be described with reference to FIG. 7. First, a growth substrate 100 is prepared. The growth substrate 100 has been described in the method according to the embodiment described with reference to FIGS. 1 to 6, and therefore, a detailed description thereof will be omitted.

Subsequently, an epitaxial layer including a plurality of layers is epitaxially grown on one surface of the growth substrate 100.

At this time, the epitaxial layer including the plurality of layers is formed by first growing an undoped semiconductor layer 300 on the surface of the growth substrate 100, growing a heavily doped semiconductor layer 200 on the undoped semiconductor layer 300, and then sequentially growing a first semiconductor layer 400, an active layer 500 and a second semiconductor layer 600 on the heavily doped semiconductor layer 200.

At this time, although not shown in this figure, a superlattice layer (not shown) may be further grown between the first semiconductor layer 400 and the active layer 500, and an electron blocking layer (not shown) may be further grown between the active layer 500 and the second semiconductor layer 600.

Therefore, this embodiment is different from the embodiment described with reference to FIGS. 1 to 6 in that the undoped semiconductor layer 300 rather than the heavily doped semiconductor layer 200 is first grown on the growth substrate 100, and the heavily doped semiconductor layer 200 is then grown.

At this time, the heavily doped semiconductor layer 200, the undoped semiconductor layer 300, the first semiconductor layer 400, the active layer 500, the second semiconductor layer 600, the superlattice layer (not shown) and the electron blocking layer (not shown) have been described in connection with the method according to the embodiment described with reference to FIGS. 1 to 6, and thus, detailed descriptions thereof will be omitted.

Subsequently, a notch 210 is formed in an edge region of the heavily doped semiconductor layer 200 through the same process as that described in connection with the method according to the embodiment described with reference to FIGS. 1 to 6.

Subsequently, a bonding layer 700 including metallic reflective pattern layer 710 may be formed on the epitaxial layer including the plurality of layers. Although not shown in this figure, an etching stop pattern (not shown) may be further formed between segments of the metallic reflective pattern layer 710.

Since the metallic reflective pattern layer 710, the bonding layer 700 and the etching stop pattern (not shown) have been described in connection with the method for separating the epitaxial layer from the growth substrate according to the embodiment described with reference to FIGS. 1 to 6, detailed descriptions thereof will be omitted.

Referring to FIG. 8, a bonding substrate 800 is prepared separately from the process of growing the epitaxial layer including the plurality of layers on the growth substrate 100.

At this time, the bonding substrate 800 has been described in the method for separating the epitaxial layer from the growth substrate according to the embodiment described with reference to FIGS. 1 to 6, and thus, a detailed description thereof will be omitted.

Subsequently, the bonding substrate 800 is brought into contact with the bonding layer 700, and heating and subsequent cooling are performed while the bonding layer 700 and the bonding substrate 800 are in contact with each other, thereby separating the epitaxial layer including the plurality of layers from the growth substrate 100.

At this time, since the undoped semiconductor layer 300 is first grown on the growth substrate 100 and the heavily doped semiconductor layer 200 is then grown on the undoped semiconductor layer 300 as shown in FIG. 8, upon separation of the growth substrate 100, the undoped semiconductor layer 300 is separated together with the growth substrate 100.

Since the separation of the epitaxial layer including the plurality of layers from the growth substrate 100 has been described in the method for separating the epitaxial layer from the substrate according to the embodiment described with reference to FIGS. 1 to 6, a detailed description thereof will be omitted.

Referring to FIG. 9, after the growth substrate 100 is separated, the exposed heavily doped semiconductor layer 200 can be removed to expose the first semiconductor layer 400, thereby completing the process of separating the epitaxial layer including the plurality of layers from the growth substrate 100.

The exposed heavily doped semiconductor layer 200 may be removed by performing an etching process or a planarization process. Although it is illustrated in this figure that the exposed heavily doped semiconductor layer 200 has been removed, the exposed heavily doped semiconductor layer 200 may be left without being removed.

Thus, in the method for separating the epitaxial layer from the growth substrate, the epitaxial layer including the plurality of layers is epitaxially grown on the growth substrate 100, and the notch 210 is formed in an edge region of any one layer of the plurality of layers in the epitaxial layer, e.g., the heavily doped semiconductor layer 200. Then, the bonding layer 700 is formed on the epitaxial layer including the plurality of layers, and the bonding substrate 800 having a thermal expansion coefficient considerably different from that of the epitaxial layer including the plurality of layers is brought into contact with the bonding layer 700. Preferably, the thermal expansion coefficient of the bonding substrate 800 is greater than that of the epitaxial layer including the plurality of layers. Thereafter, the epitaxial layer including the plurality of layers, the bonding layer 700 and the bonding substrate 800 are heated and then cooled to cause the bonding layer 700 to join the epitaxial layer including the plurality of layers and the bonding substrate 800. Subsequently, the thermal stress generated due to the difference in thermal expansion coefficient is caused to be concentrated on the notch 210 formed at any one layer of the plurality of layers in the epitaxial layer, so that the epitaxial layer including the plurality of layers can be separated from the growth substrate 100, starting from the notch 210.

According to the present invention, there is an advantage of providing a method capable of easily separating an epitaxial layer from a growth substrate without having a negative influence on the epitaxial layer.

Although the present invention has been described in connection with the aforementioned embodiments, the present invention is not limited thereto. It will be understood by those skilled in the art that various changes and modifications can be made thereto without departing from and also fall within the spirit and scope of the present invention.

The invention claimed is:

1. A method for separating an epitaxial layer from a growth substrate, the method comprising:
   growing an epitaxial layer on a growth substrate, the epitaxial layer comprising:
      growing a doped semiconductor layer on the growth substrate; and
      growing an undoped semiconductor layer on the doped semiconductor layer;
   forming a notch in an edge of the epitaxial layer, wherein the notch is formed by selectively etching the doped semiconductor layer after forming the undoped semiconductor layer;
   forming a bonding layer on the epitaxial layer, disposing a bonding substrate on the bonding layer, and then heating the bonding layer to a bonding temperature to join the epitaxial layer and the bonding substrate;
   cooling the bonding layer after heating the bonding layer, so that the epitaxial layer and the bonding substrate are joined by the bonding layer; and separating the epitaxial layer from the growth substrate,
wherein separating the epitaxial layer from the growth substrate comprises first separating the epitaxial layer starting at the notch.

2. The method of claim 1, wherein growing the epitaxial layer further comprises:
sequentially growing a first semiconductor layer, an active layer, and a second semiconductor layer on the undoped semiconductor layer.

3. The method of claim 1, wherein growing the epitaxial layer further comprises:
sequentially growing a first semiconductor layer, an active layer, and a second semiconductor layer on the doped semiconductor layer.

4. The method of claim 2, wherein the doped semiconductor layer comprises n-GaN doped with silicon, and the undoped semiconductor layer comprises u-GaN.

5. The method of claim 2, wherein the notch is formed by electro-chemical etching.

6. The method of claim 3, wherein the doped semiconductor layer comprises n-GaN doped with silicon, and the undoped semiconductor layer comprises u-GaN.

7. The method of claim 3, wherein the notch is formed by electro-chemical etching.

8. The method of claim 1, wherein the bonding temperature is a temperature ranging from 100 to 500° C.

9. The method of claim 1, wherein the bonding substrate has a thermal expansion coefficient greater than a thermal expansion coefficient of the epitaxial layer.

10. The method of claim 9, wherein thermal stress generated by the difference in thermal expansion coefficients between the bonding substrate and the epitaxial layer is concentrated on the notch.

11. The method of claim 10, wherein a crack is formed in the notch before separating the growth substrate from the epitaxial layer.

12. A method for separating an epitaxial layer from a growth substrate, the method comprising:
growing an epitaxial layer on a growth substrate, the epitaxial layer comprising a first semiconductor structure on the growth substrate, and a second semiconductor structures on the first semiconductor structures;
forming a notch in an edge of the first semiconductor structures;
forming a bonding layer on the epitaxial layer, disposing a bonding substrate on the bonding layer, and then heating the bonding layer to a bonding temperature to join the epitaxial layer and the bonding substrate; and
cooling the bonding layer after the heating of the bonding layer, so that the epitaxial layer and the bonding substrate are joined by the bonding layer and the epitaxial layer is separated from the growth substrate,
wherein separation the epitaxial layer from the growth substrate comprises first separation of the epitaxial layer starting at the notch.

13. The method of claim 12, wherein growing the epitaxial layer comprises:
growing the first semiconductor structure comprising a doped semiconductor layer and an undoped semiconductor layer; and
growing the second semiconductor structure comprising a first semiconductor layer, an active layer, and a second semiconductor layer on the undoped semiconductor layer.

14. The method of claim 12, wherein the notch is formed by selectively etching the doped semiconductor layer.

15. The method of claim 12, wherein the notch is formed by electro-chemical etching.

16. The method of claim 12, wherein the bonding substrate has a thermal expansion coefficient greater than a thermal expansion coefficient of the epitaxial layer, and
wherein thermal stress generated by the difference in thermal expansion coefficients between the bonding substrate and the epitaxial layer is concentrated on the notch.

17. The method of claim 15, wherein a crack is formed in the notch before separating the growth substrate from the epitaxial layer.

* * * * *